(12) United States Patent
Wagner et al.

(10) Patent No.: US 6,550,337 B1
(45) Date of Patent: Apr. 22, 2003

(54) ISOLATION TECHNIQUE FOR PRESSURE SENSING STRUCTURE

(75) Inventors: David E. Wagner, Los Gatos, CA (US); James H. Hoffman, Santa Clara, CA (US); Gerald Lopopolo, San Jose, CA (US)

(73) Assignee: Measurement Specialties, Inc., Fairfield, NJ (US)

( * ) Notice: Subject to any disclaimer, the term of this patent is extended or adjusted under 35 U.S.C. 154(b) by 0 days.

(21) Appl. No.: 09/489,560

(22) Filed: Jan. 19, 2000

(51) Int. Cl.[7] .............................................. H01L 27/14
(52) U.S. Cl. ................................ 73/715; 73/723; 73/756
(58) Field of Search ........................... 73/715, 717, 756, 73/718, 720, 721, 723, 726, 725, 724; 361/283, 283.4

(56) References Cited

U.S. PATENT DOCUMENTS

| | | | |
|---|---|---|---|
| 3,397,278 A | 8/1968 | Pomerantz | 174/52 |
| 3,697,917 A | 10/1972 | Orth et al. | 338/2 |
| 4,006,640 A * | 2/1977 | Gealt | 73/393 |
| 4,222,277 A | 9/1980 | Kurtz et al. | 73/721 |
| 4,322,980 A | 4/1982 | Suzuki et al. | 73/727 |
| 4,406,993 A | 9/1983 | Kurtz | 338/42 |
| 4,454,440 A | 6/1984 | Cullen | 310/313 R |
| 4,563,697 A * | 1/1986 | Miura | 357/26 |
| 4,716,492 A * | 12/1987 | Charboneau et al. | 361/283 |
| 4,739,381 A | 4/1988 | Miura et al. | 357/26 |
| 4,771,639 A * | 9/1988 | Saigusa et al. | 73/727 |
| 5,454,270 A | 10/1995 | Brown et al. | 73/720 |
| 5,461,922 A | 10/1995 | Koen | 73/756 |
| 5,465,626 A | 11/1995 | Brown et al. | 73/715 |
| 5,591,679 A | 1/1997 | Jakobsen et al. | 437/228 |
| 5,625,151 A * | 4/1997 | Yamaguchi | 73/716 |
| 5,635,649 A | 6/1997 | Tobita et al. | 73/717 |
| 5,824,910 A | 10/1998 | Last et al. | 73/715 |
| 5,852,320 A * | 12/1998 | Ichihashi | 257/419 |
| 6,066,882 A * | 5/2000 | Kato | 257/414 |
| 6,229,190 B1 | 5/2001 | Bryzek et al. | 257/419 |

FOREIGN PATENT DOCUMENTS

CH 679700 3/1992

* cited by examiner

Primary Examiner—Eric S. McCall

(57) ABSTRACT

An electronic pressure-sensing device is isolated from corrosive, conductive gasses and fluids by a corrosion resistant metal diaphragm welded to a pressure port. The pressure-sensing device is attached to a support structure with a hole that provides a path from the diaphragm area to the pressure-sensing device. A fill fluid is sealed behind the diaphragm and fills the hole through the support structure to the electronic pressure-sensing device. In this design, any hostile chemical applied is completely isolated from the electronic sensor and associated adhesive seals by the metal diaphragm.

24 Claims, 6 Drawing Sheets

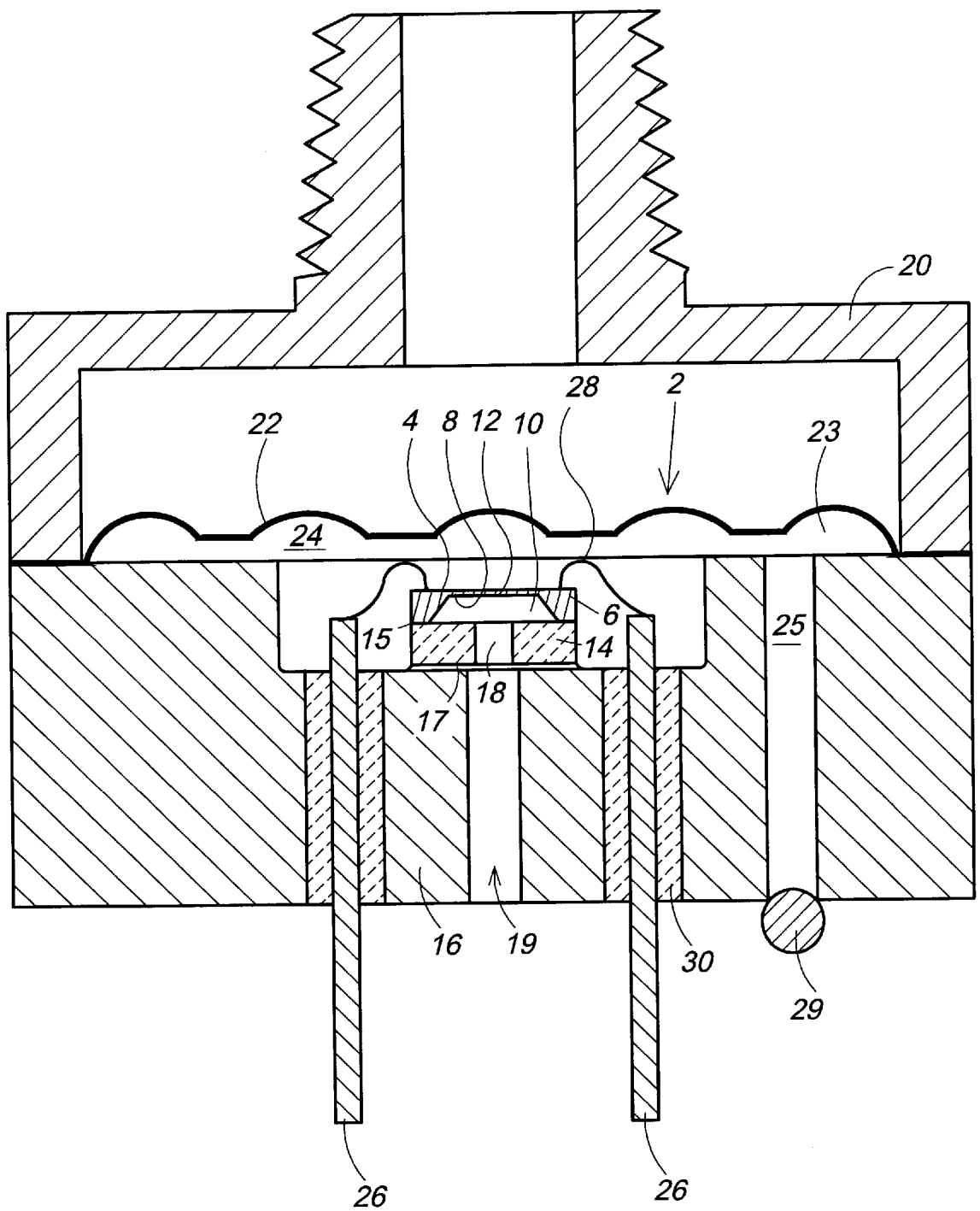
FIG._1
*(PRIOR ART)*

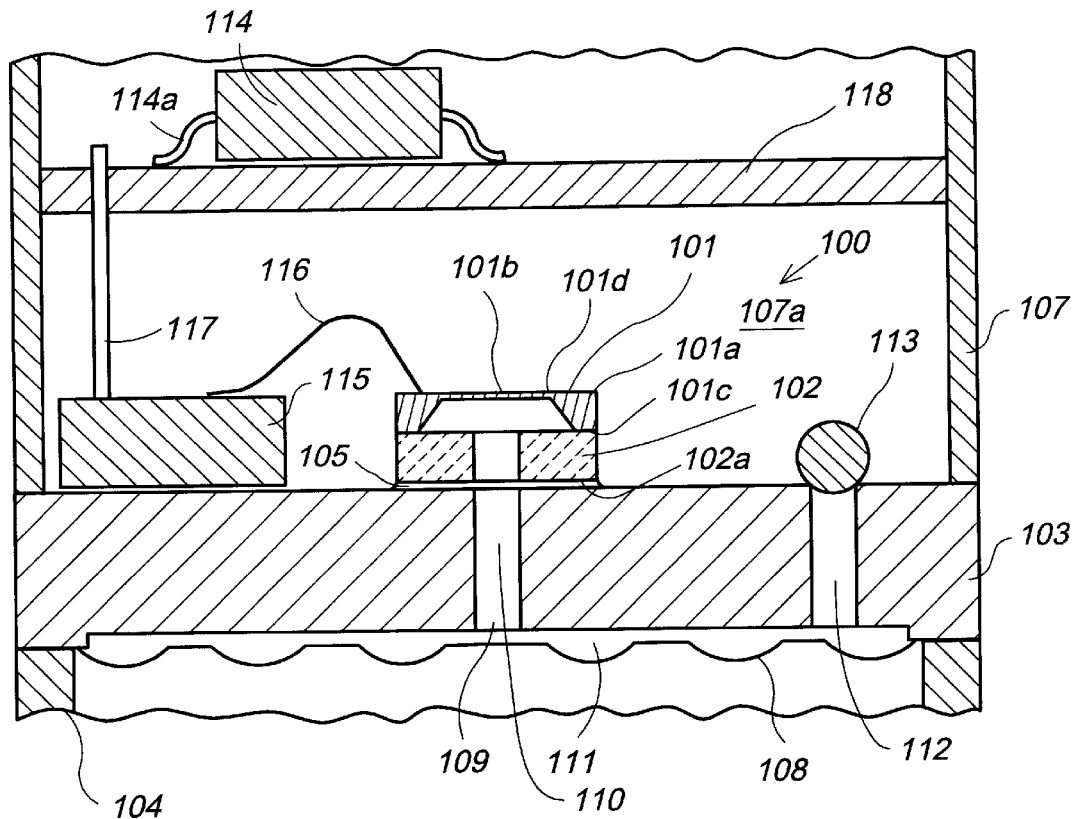
FIG._2
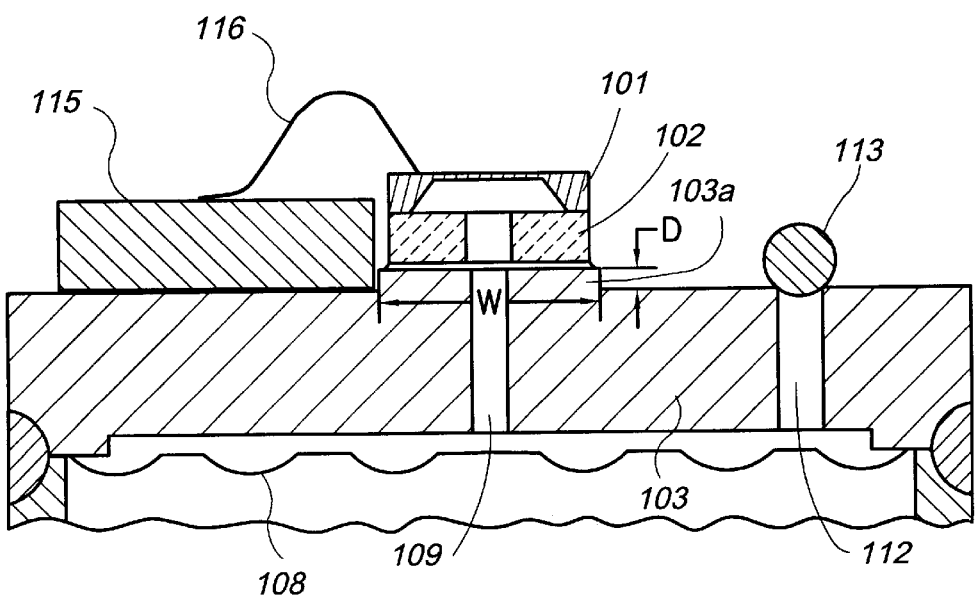
FIG._2A

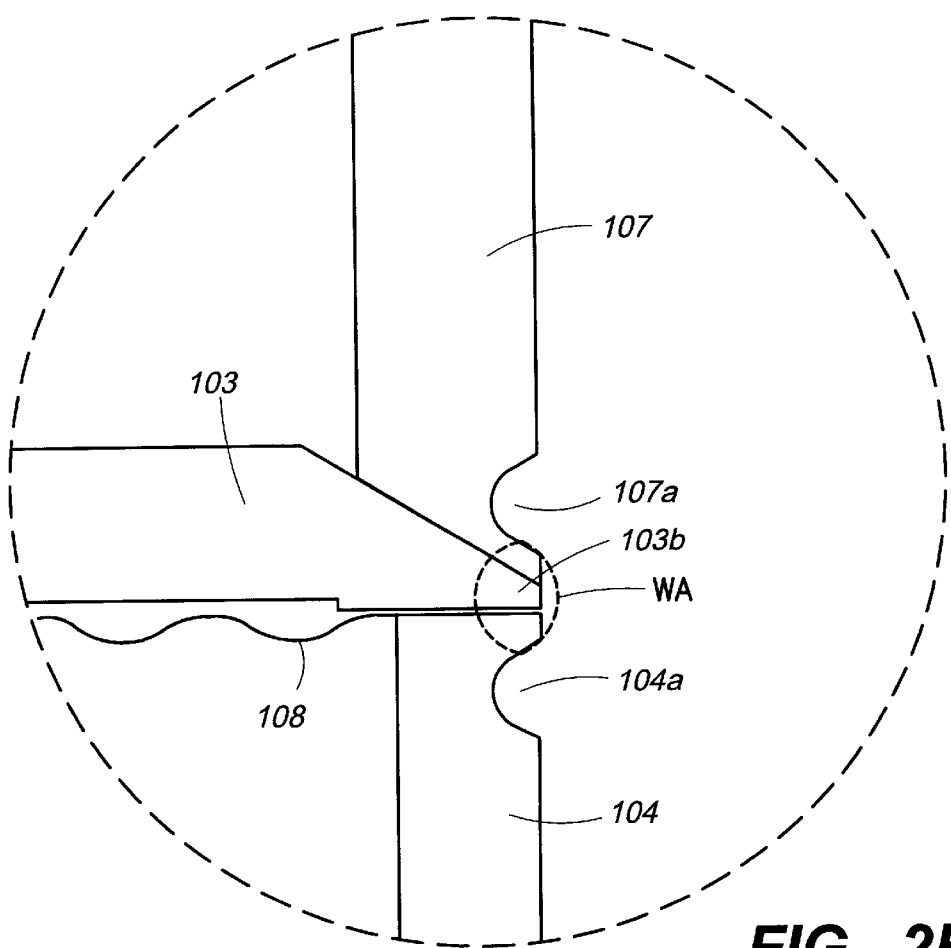
FIG._2B
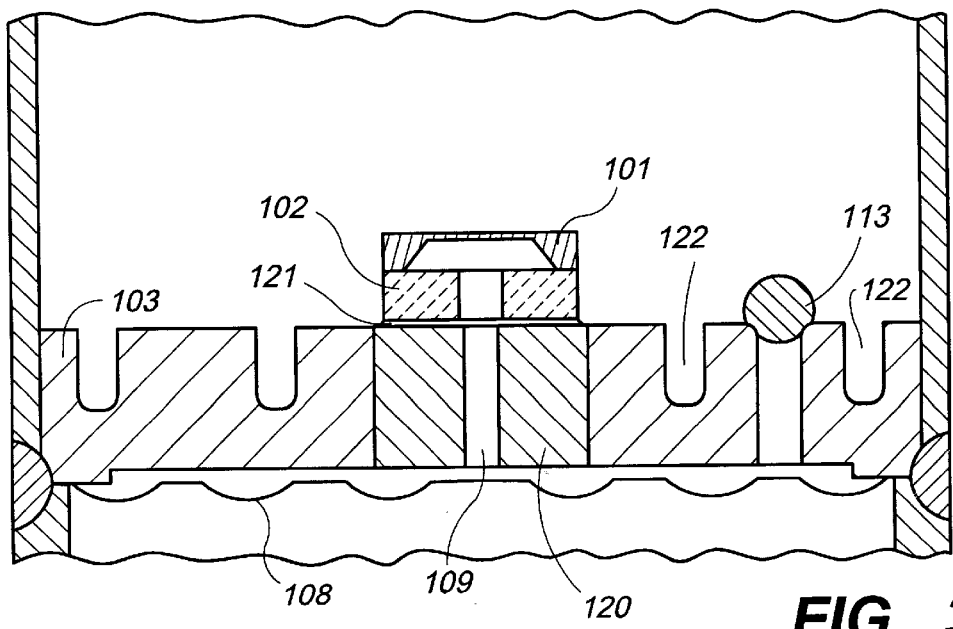
FIG._3

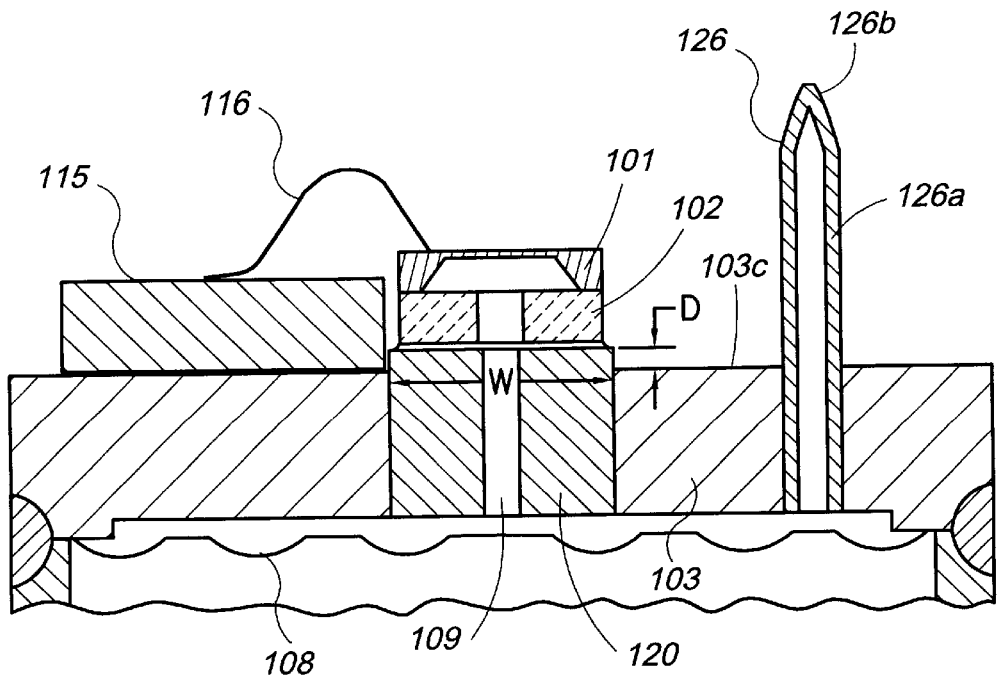
FIG._4
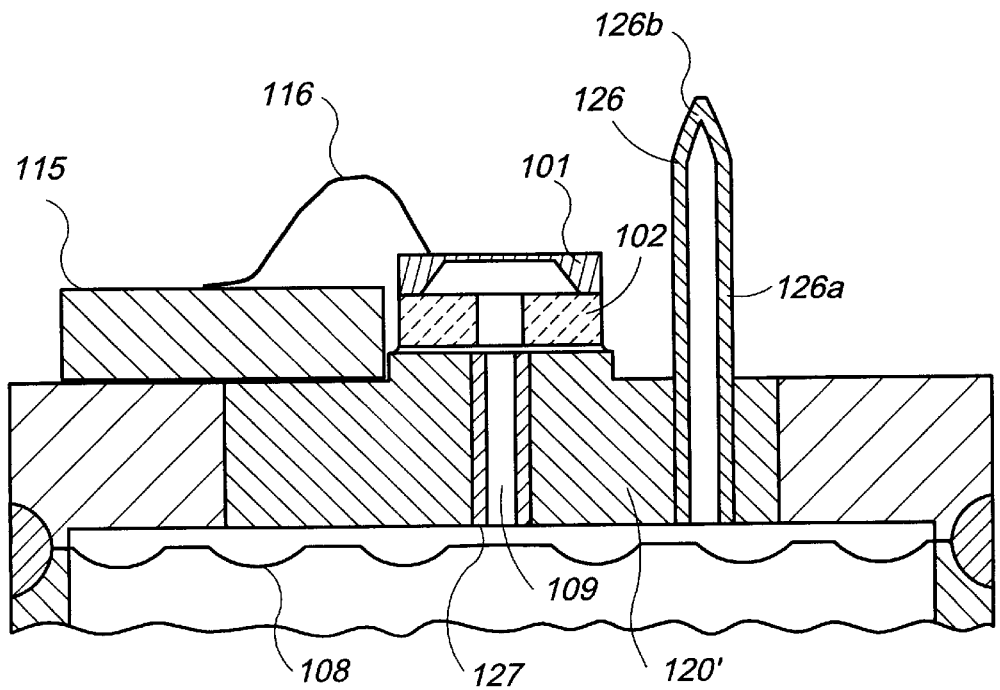
FIG._5

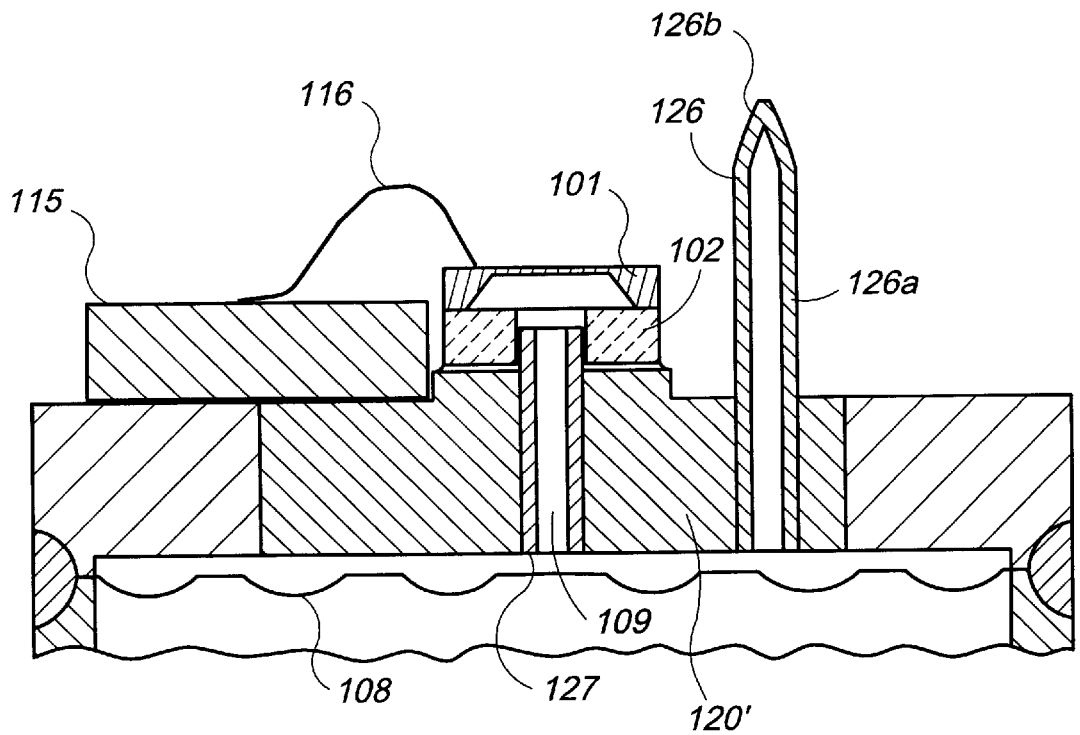
FIG._5A
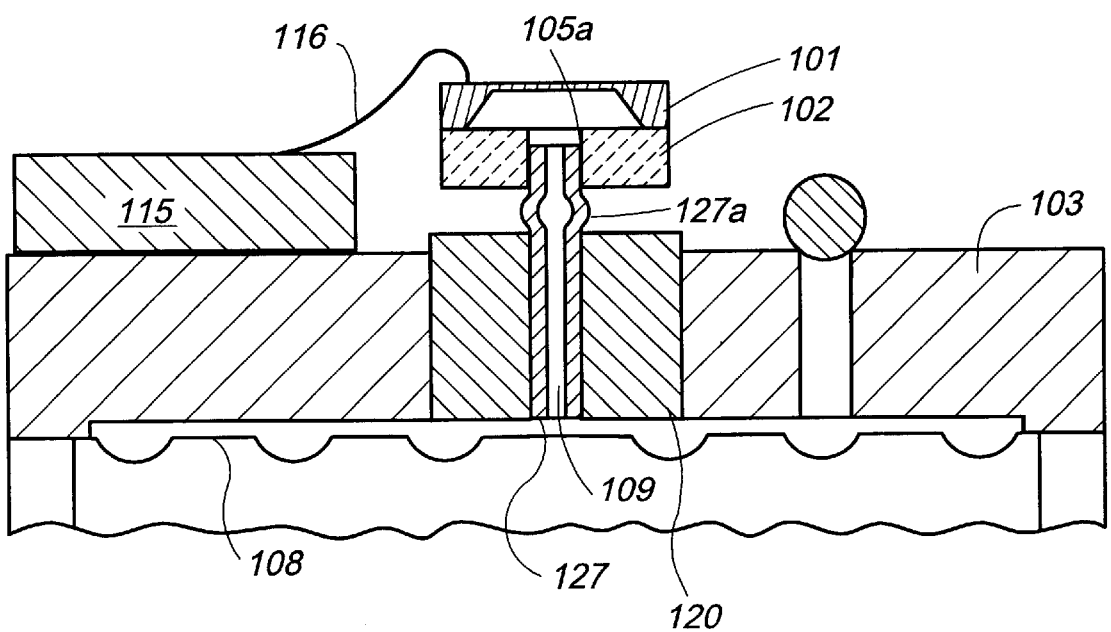
FIG._5B

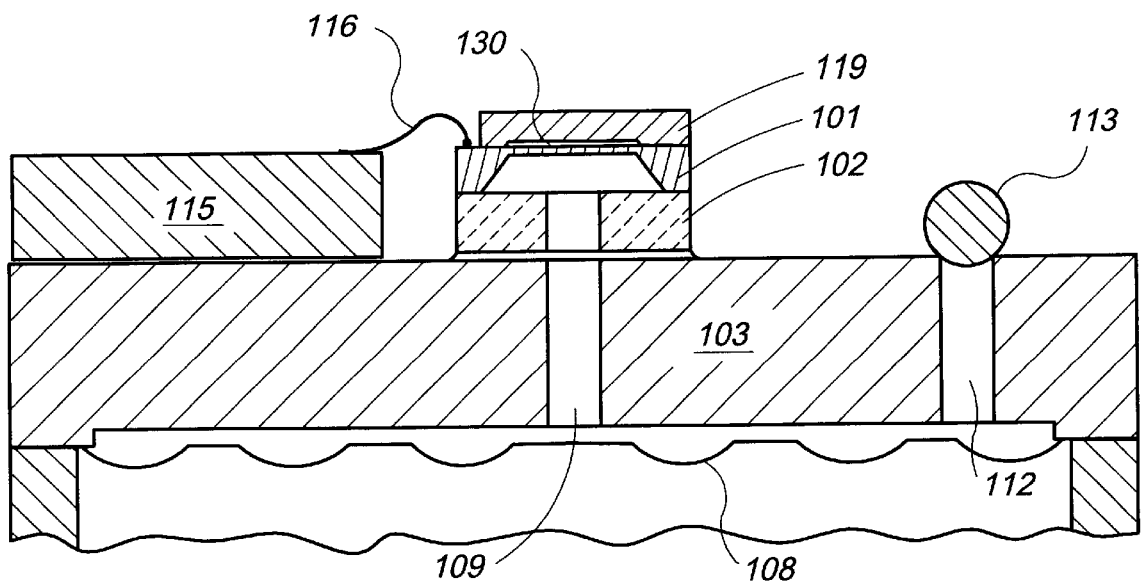
FIG._6
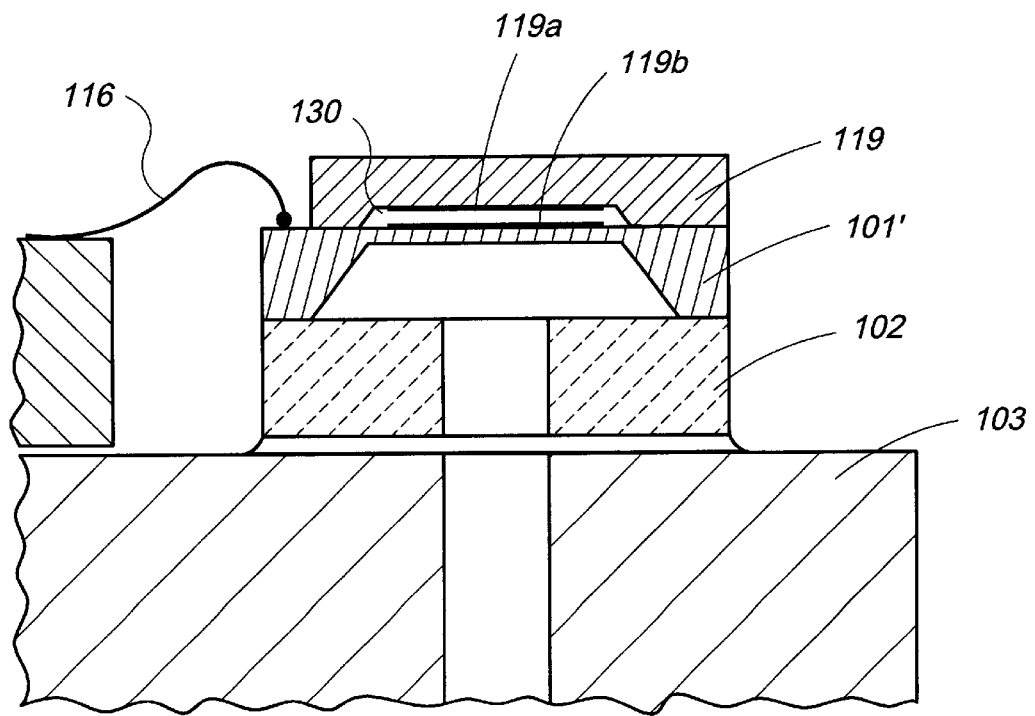
FIG._6A

ISOLATION TECHNIQUE FOR PRESSURE SENSING STRUCTURE

BACKGROUND

The present invention relates generally to pressure sensing transducers and pertains particularly to a package for transducers that is resistant to corrosive or conductive gasses and liquids.

Due to the hostile environment from highly corrosive fluids and the like, packages for electronic sensors measuring pressures in such environments are typically highly specialized, difficult to calibrate and expensive.

A pressure sensor (or pressure transducer) converts pressure to an electrical signal that can be easily measured. Sensors that incorporate micro-machining or MEMS (Micro-Electro-Mechanical System) technology are small and very accurate. Because they are fabricated similarly to the fabrication of commercial semiconductors they are also inexpensive to produce. FIG. 1 illustrates a MEMS pressure sensor 2 manufactured in accordance with the prior art. The topside 4 of the sensing element 6 (typically a silicon die) has defined resistors exhibiting a resistance that changes in magnitude in proportion to mechanical strain applied to die 6. Such resistors are called piezoresistive. The backside 8 of die 6 has a cavity 10 such that a thin diaphragm 12 of die material is formed. The alignment of the topside resistors and backside cavity 10 is such that the resistors are strategically placed in strain fields. When pressure is applied across diaphragm 12, diaphragm 12 flexes. The strain sensitive resistors and an associated circuit coupled thereto (not shown in FIG. 1) provide an electrical signal constituting a measure of this pressure.

Often, silicon die 6 is bonded to a support structure 14 with a bonding adhesive 15 or other method such as anodic bonding. Support structure 14, is bonded to a stainless steel plate 16 with a bonding adhesive 17. (Plate 16 is sometimes referred to as a header). Support structure 14 is made from a material such as glass or silicon, and helps isolate diaphragm 12 from sources of strain that are unrelated to pressure, e.g. thermal expansion or contraction of header 16. Support structure 14 includes a centrally defined opening 18 directly adjacent to and in fluid communication with cavity 10. Header 16 comprises a pressure port 19 in fluid communication with opening 18. This port 19 can be used to seal a vacuum in cavity 10. Alternatively, port 19 can be used to permit cavity 10 to be maintained at ambient pressure.

Header 16 is welded to a second port 20. Port 20 is connected to a body (e.g. a pipe, container or other chamber, not shown) containing fluid (e.g. a gas or a liquid) whose pressure is to be measured by sensor 2. Port 20 serves as a conduit for applying this fluid to sensor 2.

A drawback to MEMS sensors is that conductive and corrosive fluids (gases and liquids) can damage the sensor and the electronic structures (e.g. resistors) that are used to measure the pressure. Backside 8 of die 6 and adhesive bonds 15 and 17 are also susceptible to corrosion. To be used with corrosive or conductive fluids these sensors require some kind of isolation technique.

A popular isolation technique is to interpose a stainless steel diaphragm 22 between die 6 and port 20. Diaphragm 22 is welded to port 20 and header 16. A cavity 23 is thus formed between diaphragm 22 and header 16, and this cavity 23 is filled with a non-corrosive, non-conductive liquid such as silicone oil 24. Thus, diaphragm 22 and oil 24 isolate die 6 from any corrosive material in port 20.

When pressure is applied by the fluid in port 20 to diaphragm 22, diaphragm 22 deflects slightly, pressing on oil 24, which in turn presses on die 6. The pressure on die 6 is then detected by measuring the resistance of the piezoresistive resistors formed in diaphragm 12 of die 6. Corrosive media, the pressure of which is being measured, is kept away from the electronics by stainless steel diaphragm 22 and oil 24.

Header 16 often has at least one small hole 25 used to fill cavity 23 with oil 24. After cavity 23 is filled with oil 24, hole 25 is welded shut, e.g. with a welded ball 29. The design of FIG. 1 also includes metal pins 26 that are hermetically sealed to, but pass through, header 16. (Pins 26 are typically gold plated.) Gold or aluminum wires 28 are bonded to and electrically connect die 6 to metal pins 26. Pins 26 and wires 28 are used to connect die 6 to electronic circuitry (not shown in FIG. 1, but located below header 16) so that the resistance of resistors within die 6 can be measured.

A significant drawback the design of FIG. 1 is that when the temperature is increased, oil 24 expands and exerts pressure on stainless steel diaphragm 22 and sensor die 6. The resulting pressure change due to temperature causes the calibration of the sensor to change with temperature. The resulting errors introduced into the sensor measurements may contain linear and nonlinear components, and are hard to correct. The extent of this error is proportional to the amount of oil 24 contained in cavity 23. The more oil contained in cavity 23, the more oil there is to expand and thus more error over temperature. Currently existing designs require a substantial amount of oil for at least the following reasons: a) pressure sensing die 6 is enclosed inside oil filled cavity 23, and thus cavity 23 must be large enough to accommodate die 6; b) there are four hermetic pins 26 that must be wire bonded to die 6 (only two of which are shown in FIG. 1) so cavity 23 must also accommodate pins 26 and bonding wires 28; and c) cavity 23 must also accommodate manufacturing tolerances that are large enough to permit assembly of die 6, wiring 28 and the associated housing.

Another drawback to this design arises out of the fact that die 6 is made of silicon, which has a low coefficient of thermal expansion. Because die 6 must be mounted to stainless steel, and stainless steel has a relatively high coefficient of thermal expansion, a compliant die attach structure must be used. Typically this compliant die attach structure is a silicone elastomer. Because the silicone elastomers are not hermetic, when high vacuums are present, gas is drawn through the silicone and into the oil. This causes large shifts in the offset calibration of the sensor due to the pressure of the gas drawn into cavity 23.

A third drawback to this design is the fact that hermetic feedthrough pins 26 are costly and problematic. In particular, this design requires metal pins 26 extending through glass regions 30 that serve as the hermetic seals. Glass 30 can crack. Also, pins 26 must be gold plated and flat on top to permit wire bonding. These designs are difficult to customize and the hermetic seals can be a leak point that must be checked before the sensor is assembled.

Attempts have been made to provide a corrosion resistant package using a non-fluid filled housing and polymeric or hermetic seals to seal the housing directly to the die. These methods allow corrosive material to travel inside and contact the die and sealing surfaces. Here, the amount of corrosion protection is limited because the sensor and associated seals are subject to damage by corrosive and possibly conductive materials. There have been some attempts to provide a polymeric barrier on the inside of the die and seal area. Conformal coatings such as Parylene or silicone materials only provide minimal corrosion improvement.

To maintain high quality and low cost it is desirable to construct an isolation technique that holds as little oil as possible, is readily assembled by automated processes, is easily modified for custom applications, and avoids unnecessary machining and assembly costs for hermetic feed through pins.

SUMMARY

A pressure sensor in accordance with the invention comprises a die having pressure-sensing electrical components formed in a first side of the die. The pressure-sensing electrical components are typically resistors whose resistance changes as a function of pressure. Alternatively, the pressure-sensing electrical components can be capacitors whose capacitance changes as a function of pressure. The electrical components within the die are coupled to bonding structures such as bonding wires.

In one embodiment, instead of placing the die inside an oil filled cavity with the pressure-sensing electrical components and electrical bonding structures on the side of the die facing oil, the side of the die containing the electrical components and the bonding structures coupled thereto do not face an oil-filled cavity.

In one embodiment, a second side of the die contacts oil in an oil-filled cavity. The die is bonded and sealed to a plate (i.e. a header) such that the oil is kept away from the first side of the die. Because of this, the volume of oil in the oil-filled cavity can be greatly reduced compared to the sensor of FIG. 1. This is because the oil-filled cavity does not have to be large enough to surround the die, bonding wires and pins coupled thereto. In particular, the cavity does not have to be large enough to accommodate pins that are hermetically sealed to the header. Further, the oil-filled cavity does not have to be large enough to accommodate electrical assembly tolerances.

The passages and cavities are very small and thus the oil fill fluid volume is small. Finally, because there is no need for hermetic feed through pins, the reliability and cost of the sensor package is greatly improved.

In one embodiment, the die is bonded to the header using a hermetic die attach material. By using a hermetic die attach material (e.g. glass, solder or braze), gas cannot be pulled through the adhesive. Because of the use of hermetic die attach material, the sensor package can withstand high vacuum for extended periods of time without suffering damage.

BRIEF DESCRIPTION OF THE DRAWINGS

FIG. 1 illustrates in cross section a pressure sensor constructed in accordance with the prior art.

FIG. 2 illustrates in cross section a pressure sensor in accordance with the present invention comprising a flat header and an oil-bearing cavity in which oil is not exposed to the sensor resistors.

FIG. 2A illustrates in cross section a modified version of the pressure sensor of FIG. 2 in which a raised area is provided in a header. This raised area is bonded to a support structure which, in turn, is bonded to the sensor die.

FIG. 2B illustrates in cross section a portion of a pressure sensor in accordance with the invention where a header, stainless steel diaphragm, housing and port are welded together.

FIG. 3 illustrates in cross section an embodiment of the invention in which the header comprises a set of annular grooves for isolating a sensor die from externally applied mechanical stresses. The FIG. 3 embodiment also includes a glass feedthrough for facilitating the attachment of the sensor die to the header.

FIG. 4 illustrates in cross section an embodiment similar to FIG. 3, except that the top surface of the feedthrough extends above the top surface of the header, and a tube extends through the header so that oil can be provided in the oil-filled cavity.

FIG. 5 illustrates in cross section an embodiment similar to FIG. 4, except that the oil input tube extends through the glass feedthrough. Also, another metal tube extends through the glass feedthrough to facilitate fluid communication to the pressure sensor.

FIG. 5A illustrates in cross section an embodiment similar to FIG. 5, except in FIG. 5A a fill tube extends above the top surface of a glass feed through.

FIG. 5B illustrates in cross section an embodiment similar to FIG. 5A, except the fill tube extends slightly further above the top surface of a glass feed through, and a support structure is bonded to the fill tube.

FIG. 6 illustrates in cross section an embodiment in which a cap is placed over the pressure sensor die.

FIG. 6A illustrates a modified version of the embodiment of FIG. 6 using a capacitive sensing mechanism to sense pressure.

DETAILED DESCRIPTION

While the invention is described below with reference to certain illustrated embodiments, it is understood that these embodiments are presented by way of example and not by way of limitation.

FIG. 2 illustrates in cross section a pressure sensor assembly 100 comprising a micro-machined silicon pressure sensor die 101 comprising a frame portion 101a surrounding a thinned diaphragm portion 101b. (Diaphragm portion 101b is typically formed by thinning a portion of a silicon wafer using either a liquid or dry etching process.) Piezoresistive resistors are formed in the top surface of die 101 in diaphragm portion 101b, e.g. by ion implantation or diffusion. These resistors are formed in locations on diaphragm 101b where the strain is greatest when diaphragm 101b is exposed to fluid under pressure.

Die 101 is anodically bonded to a support structure 102. Support structure 102 is sometimes referred to as a "constraint," and is typically silicon or glass. In one embodiment, diaphragm portion 101b of pressure sensor die 101 is between 15 and 100 microns thick. (The exact thickness depends upon the pressure range that the sensor is to measure.) Frame portion 101a of die 101 is typically between 300 and 650 microns thick (e.g. 375 microns). Die 101 is typically square or rectangular, and is between 40 and 200 mils on a side. Support structure 102 is typically between 15 and 70 mils thick (usually but not necessarily thicker than die 101), is square or rectangular, and is between 40 and 200 mils on a side. Die 101 and support structure 102 can be bonded together in wafer form using an anodic bonding process, e.g. as described U.S. Pat. No. 3,397,278, issued to Pomerantz, and U.S. Pat. No. 3,697,917, issued to Orth et al. The '278 and '917 patents are incorporated herein by reference. Die 101 and support structure 102 are then sawed into the assembly shown. Other methods can be used to bond support structure 102 to die

101 such as silicon fusion bonding, glass frit bonding, or other commonly known techniques.

Support structure 102 provides mechanical isolation between sensor die 101 and a plate or header 103. For example, the coefficient of thermal expansion of die 101 is typically less than that of header 103. Support structure 102 serves as a mechanical buffer to limit or reduce the amount of stress applied to die 101 caused by the thermal expansion or contraction of header 103. Also, if some external force is applied to header 103, causing it to bend or flex, support structure 102 tends to reduce the amount of stress applied to die 101 as a result of that bending or flexing. If support structure 102 is formed from an electrically insulating material, it will electrically insulate die 101 from header 103. (The body of die 101 is typically positively biased. Accordingly, it is advantageous to insulate die 101 from electrically conductive portions of the sensor package.) Lastly, if die 101 were attached directly to header 103, the die attach area would be equal to the area of the bottom surface 101c of frame region 101a of die 101. In contrast, the bonding area 102a between support structure 102 and header 103 is typically larger than bottom surface 101c of frame region 101a. Thus, one can form a stronger bond between support structure 102 and header 103 than one could form between die 101 and header 103 if die 101 were bonded directly to header 103.

Support structure 102 is attached to a header 103 with a low temperature glass or solder 105. (By low temperature glass we mean a glass having a relatively low melting temperature, e.g. below about 750° C.)

Header 103 is typically an alloy in which iron is not the major component. In one embodiment, the alloy from which header 103 is fabricated is substantially free of iron. For example, in one embodiment, header 103 comprises Hastalloy. (Hastalloy is a nickel alloy.) Hastalloy has the following advantages:

1. Hastalloy resists corrosion.
2. As explained below, header 103 is welded to one or more structures comprising stainless steel. One can weld Hastalloy to stainless steel using a weld that does not tend to corrode.
3. Hastalloy has a relatively low coefficient of thermal expansion. Thus, the thermal expansion of Hastalloy is closer to that of silicon than other commonly used materials, e.g. stainless steel.

While Hastalloy is advantageous, in other embodiments, other materials are used for header 103, e.g. 400 series stainless steel, cold roll steel (i.e. typical carbon steel), kovar, alloy 42, or other controlled expansion metals. In one embodiment, header 103 is a controlled expansion metal, e.g. having a coefficient of thermal expansion less than $13 \times 10^{-6}$/°C.

A diaphragm 108 is attached, e.g. by welding, soldering or brazing to header 103. Diaphragm 108 is typically stainless steel, and can have convolutions as schematically shown in FIG. 2. Diaphragm 108 can also be made of Hastalloy, Inconnel, brass, or other corrosion resistant material. In one embodiment, welding is accomplished using TIG (tungsten inert gas). In another embodiment, welding is accomplished using an e-beam or a laser. A port 104 (typically a stainless steel alloy such as 316 stainless steel, and typically structurally rigid) is affixed, e.g. by welding or brazing to header 103 at the same time as diaphragm 108 so that only one joint is needed. Port 104 is typically connected to a cavity or conduit containing a medium the pressure of which is to be measured using pressure-sensing die 101.

A housing 107 may also be attached to header 103 at this time so that a single weld joins housing 107, header 103, diaphragm 108 and port 104. Housing 107 surrounds and protects die 101. A fill fluid such as silicone oil 109 is degassed and sealed inside a space comprising a) a conduit 110 and b) the volume 111 between diaphragm 108 and header 103. The fill fluid is introduced inside this space via a conduit 112 that is then sealed by a welded ball 113. Other methods may be used to seal oil 109 inside this space such as crimping a tube, re-flowing solder or other methods known to the art. All structure materials and seal materials to which oil 109 is exposed are selected such that no gas may pass therethrough into oil 109, even with a high differential pressure or vacuum applied to the pressure sensor.

FIG. 2B illustrates in cross section a portion of the pressure sensor where header 103, port 104, housing 107 and diaphragm 108 are welded together at a weld point WA. As can be seen, an outer portion 103b of header 103 is narrowed to facilitate such a weld point. Also shown is an indentation 107a in housing 107 and an indentation 104a in port 104 where housing 107 meets header 103. These indentations facilitate welding by reducing thermal conduction away from the weld point. Also, they are particularly useful for arc welding, since the arc tends to jump to the highest point.

A plurality of wires connects die 101 to a compensation circuit 114. In one embodiment, die 101 is coupled to a board 115 by a set of wires, one of which is shown as wire 116. (Bonding pads are typically formed on die 101 and board 115 to facilitate bonding wire 116 thereto.) A conductive trace on board 115 (not shown) electrically couples wire 116 to wire 117. Wire 117 extends upward to and electrically contacts a conductive trace (not shown) on a PC board 118, which in turn electrically couples wire 117 to a leg or pin 114a of a compensation circuit 114. (There are other wires and traces, not shown in FIG. 2, that couple other bonding pads on die 101 to the other legs or pins of circuit 114 in a manner similar to wires 116 and 117 and the above-described traces on boards 115 and 118.) Compensation circuit 114 is mounted on PC board 118, which in turn is affixed to housing 107. Connections to compensation circuit 114 through housing 107 can be made through a connector or a plurality of wires extending through housing 107 (not shown). Compensation circuit 114 can be a device similar to the circuit described in "Solid-State Pressure Sensors Handbook", Vol. 16, published by Sensym, Inc. of Milpitas, Calif. in 1998, incorporated herein by reference. See, for example, pages 8–70 to 8–73 and 8–92 to 8–93.

Although board 115 is illustrated as being on one side of die 101 (the left side), board 115 typically extends in front of and in back of die 101, and thus typically surrounds die 101 on three sides.

As mentioned header 103 is typically made from an alloy such as Hastalloy. Hastalloy has several characteristics that make it desirable for manufacturing header 103. First, Hastalloy resists corrosion. Second, as mentioned above, header 103 is typically welded to one or more structures made of stainless steel. When welding Hastalloy to stainless steel, one can form welds that resist corrosion.

Hastalloy also enjoys the advantage of a relatively low coefficient of thermal expansion. This is important because silicon has a relatively low coefficient of thermal expansion, e.g. between $2 \times 10^{-6}$ and $2.3 \times 10^{-6}$/°C. 316 stainless steel has a coefficient of thermal expansion of about $18 \times 10^{-6}$/°C. Because of this mismatch in thermal expansion between silicon and stainless steel, if one made header 103 out of stainless steel, temperature changes would result in stress applied to silicon sensor die 101. Such a stress would introduce inaccuracies into the pressure measurements provided using die 101. By using a material like Hastalloy (which has a coefficient of thermal expansion of only $12 \times 10^{-6}/°C$.) the mismatch in thermal expansion between the silicon and header 103 is minimized.

The embodiment of FIG. 2 has the following additional features:

First, only one diaphragm 101*b* is included in sensor 101, and pressure is only measured from a side 101*d* of sensor 101 that is not exposed to oil. In other words, piezoresistive resistors are formed in silicon on side 101*d* of sensor 101 facing away from oil 109. In addition, wires 116, bonded to these resistors, are not exposed to oil 109. This is advantageous because it avoids having to extend pins through a hermetic seal, e.g. as in the design of FIG. 1. It is also advantageous because a smaller volume of oil can be used when the oil is not exposed to side 101*d* of die 101. The reason is that the cavity 107*a* on side 101*d* of die 101 must be sufficiently large to accommodate bonding wires, and structures that the bonding wires connect to. It requires more oil to fill this volume than the volume of oil required to fill cavity 111 and conduit 110. Because less oil is required to fill cavity 111 and conduit 110, sensor 101 encounters less thermal expansion of oil if the temperature increases. This smaller amount of thermal expansion of oil results in application of less pressure to die 101, thereby reducing distortion of the pressure measurements provided by die 101.

Second, header 103 is relatively flat. Thus, it is easy to fabricate a header 103 in accordance with the invention. For example, header 103 can be formed by stamping. Alternatively, header 103 can be formed by machining, etching or sintering.

As mentioned above, the above-described embodiment uses a low temperature glass to bond support structure 102 to header 103. However, in another embodiment, support structure 102 is bonded to header 103 by soldering or brazing. For the case of a Hastalloy header, this can be done by a) plating nickel on the bonding area of header 103; and b) using a solder or brazing material to attach support structure 102 to the bonding area. The solder or brazing material can be a eutectic material such as AuSi, AuSn or SnPb.

In an alternative embodiment using a Hastalloy header, gold is plated onto the nickel prior to the above-mentioned brazing or soldering. For an embodiment in which header 103 is ceramic, it is preferable to use low temperature glass to bond support structure 102 to header 103.

FIG. 2A shows a modified embodiment of the invention in which header 103 comprises a raised section 103*a* in the bonding area so as to a) define the sealing area (where support structure 102 is to be sealed to header 103) and b) to be used as a guide during assembly. In this embodiment, width W of raised section 103*a* is greater than or equal to the width of support structure 102 and die 101.

FIG. 3 illustrates in cross section a sensor assembly similar to that of FIG. 2. However, in FIG. 3, support structure 102 is attached to a glass feedthrough 120 that is hermetically sealed to header 103 through a glass seal. (The manner in which glass feedthrough 120 is hermetically sealed to header 103 is similar to seals in the hermetic connector industry.) Glass feedthrough 120 provides improved electrical insulation between die 101 and header 103 compared to that of the header design in FIG. 2. FIG. 3 also shows a low thermal expansion bonding area 121 where support 102 is bonded to feedthrough 120. This is especially advantageous if a low temperature glass is used for bonding support structure 102 to feedthrough 120. As mentioned above, silicon 101 has a thermal expansion coefficient between $2 \times 10^{-6}$ and $2.3 \times 10^{-6}/°C$., Hastalloy has a thermal expansion coefficient of about $12 \times 10^{-6}/°C$., and sealing glass has a thermal expansion coefficient of about $9 \times 10^{-6}/°C$. By bonding support structure 102 to glass feedthrough 120, less thermal stress is applied to bonding area 121 than if support structure 102 were bonded directly to header 103.

If support structure 102 is a material such as silicon, typically a metallic material is applied to the top surface of glass feedthrough 120 to facilitate bonding of support structure 102 to feedthrough 120. On one embodiment, a material such as nickel or chromium is deposited on feedthrough 120 (e.g. by sputtering, or sputtering followed by plating), and then support structure 102 is soldered or brazed to the nickel or chromium.

Glass feedthrough 120 can be provided in header 103 with a compression seal. In other words, glass feedthrough 120 is provided in header 103 when both the glass and the header are hot. As the temperature drops, because header 103 has a higher coefficient of thermal expansion, it will contract around feedthrough 120 and apply a compressive mechanical force on feedthrough 120, thus adding to the forces that tend to hold feedthrough in place.

Also shown in FIG. 3 are annular grooves 122, which are provided in header 103 to help isolate outside strain due to welding or installation from the inside assembly. In particular, header 103 will bend at annular grooves 122, thereby mitigating the amount of stress applied to sensor 101.

FIG. 4 shows another embodiment where glass feedthrough 120 extends above the header top surface 103*c* to provide additional electrical isolation and package strain isolation between header 103 and die 101. In one embodiment, feedthrough 120 extends above surface 103*c* by a distance D less than 20 mils, e.g. between 5 and 20 mils, and typically about 10 mils. Also, in one embodiment, feedthrough 120 has a width W less than about 200 mils, and typically about 160 mils. The aspect ratio of the portion 120*a* of feedthrough 120 extending above header top surface 103*c* is typically 8 to 1 (width to height) or greater.

Also shown in FIG. 4 is a crimped tube type fill fluid seal 126 for introducing silicone oil into the sensor. Here a tube 126*a* is sealed to header 103 by a braze or glass seal. Thereafter, an end 126*b* of tube 126*a* is hermetically sealed by crimping or soldering after filling the inner cavity with fill fluid 109 (again, typically a liquid such as oil.)

It is noted that prior art U.S. Pat. No. 5,635,649 discusses an embodiment of a sensor mechanism comprising a stationary base 2 extending above a housing 4 for supporting a die 1 (see '649 FIG. 1). Feedthrough 120 is different from '649 stationary base 2 in several regards. For example, the '649 patent requires a thin walled region 22 for absorbing thermal strains from '649 housing 4 and pressure strains due to application of a static pressure. In order to perform this function, thin wall region 22 has a width that is less than the width of '649 pressure sensing chip 1. In stark contrast, feedthrough 120 has a width W' that is substantially equal to or greater than the width of die 101.

Also, the ratio of the height to width of the raised portion feedthrough 120 is much smaller than the ratio of the height of structure 2 to the width of structure 2 in the '649 patent.

FIG. 5 shows another embodiment where a single glass seal 120' provides the seal for fill tube 126*a* and the bonding area for support structure 102. In addition, FIG. 5 shows a tube 127 inserted in glass seal 120' to provide a cost effective way of making a hole through glass seal 120' to permit fluid communication of oil 109 die 101. Tube 127, if smaller in diameter than hole 102b in support structure 102, can also be raised above the top surface of glass seal 120' slightly so as to be used as an alignment fixture during assembly (see FIG. 5A). This configuration has the advantage of reducing cost compared with the embodiment of FIG. 4, as only one hole needs to be drilled in header 103 when manufacturing the embodiment of FIGS. 5 and 5A. Tube 127 is also advantageous, in that it is difficult to bore a small diameter fill hole directly through glass 120'. It is much easier and less expensive to insert metal fill tube 127 through glass seal 120'.

The mechanical isolation between the header and the die may be further improved using an embodiment in accordance with FIG. 5B, in which a tube 127 includes a portion 127a extending above header 103 and into a region between header 103 and support structure 102. In this embodiment, tube 127 is sealed to header 103 by a hermetic feed through 120. Tube 127 is typically made of a controlled expansion material such as Kovar or Alloy 42. Support structure 102 and die 101 are joined together as in the above-described embodiments. Tube 127 is inserted inside support structure 102 providing a joined surface that has a large seal area 105a but small in diameter. Support structure 102 is then adhered to tube 127 with an adhesive or a hermetic material such as low temperature glass or solder. The oil fill fluid has a path 109 from header 103 to die 101 and tube 127 provides mechanical isolation.

A bulge or shelf 127a is formed in tube 127 so that during assembly, support 102 does not fall past bulge or shelf 127a.

In lieu of glass feed through 120, tube 127 can be sealed to header 103 by brazing, soldering or welding. This alternative embodiment has a cost advantage, but does not provide electrical isolation between header 103 and die support structure 102.

FIG. 6 shows a cap 119 attached to die 101 to provide a sealed absolute vacuum reference cavity 130. Cap 119 is typically silicon or glass. Alternatively, cap 119 can be metal. Cap 119 can be positioned such that the clearance between diaphragm and cap is very small, thus limiting the diaphragm travel and effectively increasing the burst pressure of the diaphragm. Cap 119 can be used as a surface an electrode 119a if instead of using a piezoresistive die 101, a capacitive die 101' is used (FIG. 6A). (The other electrode 119b of the capacitive sensor is formed on die 101', e.g. by sputtering or vacuum deposition.) Cap 119 can be between 300 and 650 microns thick, and can be bonded to die 101 by anodic bonding, silicon fusion, a glass frit or soldering.

Thus specific embodiments of the invention have been described above, it is to be understood that numerous changes and modifications may be made therein without departing from the spirit and scope of the invention. For example, a pressure sensor in accordance with our invention can be used without oil isolation. Such an embodiment lacks a ball seal or a crimped tube as discussed above.

In another embodiment, fluids (e.g. liquids) other than oil can be used to isolate a die from a medium whose pressure is to be measured.

As mentioned above, support structure 102 can be silicon or glass. If support structure 102 is silicon, it can be bonded to die 101 using anodic bonding, silicon fusion bonding, or other silicon-to-silicon or silicon-oxide-silicon bonding methods.

As mentioned above, header 103 is a low coefficient of thermal expansion material, preferably containing low or very little iron. Header 103 can be Hastalloy, or other alloys such as Inconnel. Header 103 can also be ceramic. Die 101 can be a material other than silicon. Also, die 101 can comprise more than one diaphragm. Accordingly, all such changes come within the invention.

We claim:

1. A pressure sensor comprising:
   a pressure sensing die having a first surface and a second surface, a pressure sensitive electronic component being formed in or on said first surface;
   a plate having a hole therein, said second surface of said pressure sensing die being affixed to said plate such that at least a portion of said second surface is in fluid communication with said hole, liquid being provided in said hole and pressing against said portion of said second surface, wherein said pressure sensing die provides a measure of the pressure with which said liquid presses against said die, and wherein said first surface is not in a liquid environment;
   a reservoir containing said liquid, said reservoir being in fluid communication with said pressure sensing die through said hole in said plate; and
   a diaphragm extending between said reservoir and a space, said diaphragm and said liquid applying pressure in said space to said pressure sensing die.

2. Pressure sensor of claim 1 wherein said die comprises a semiconductor material and said pressure-sensitive electronic component is a resistor formed in said first surface, said die comprising:
   a frame portion; and
   a diaphragm portion, said frame portion surrounding and being contiguous with said diaphragm portion, said resistor being formed in said diaphragm portion.

3. Pressure sensor of claim 1 wherein said die is affixed to a support structure and said support structure is affixed to said plate.

4. Pressure sensor of claim 3 wherein said support structure comprises glass, and said die is anodically bonded to said glass.

5. Pressure sensor of claim 3 wherein said support structure comprises glass, and said die is bonded to said support structure with a low temperature glass.

6. Pressure sensor of claim 5 wherein said low temperature glass has a melting point less than or equal to about 750° C.

7. Pressure sensor of claim 1 further comprising a set of bonding wires affixed to said first side of said die and electrically coupled to said pressure-sensitive electronic component so that a resistance of said pressure-sensitive electronic component can be measured via said bonding wires, and wherein said bonding wires are not exposed to a liquid environment.

8. Pressure sensor of claim 1 wherein said plate comprises Hastalloy.

9. Pressure sensor of claim 3 wherein said plate is metallic, a hole extending through said plate, glass being formed in said hole, said support structure being affixed to said glass.

10. Pressure sensor of claim 9 wherein a tube extends through said glass, said reservoir being in fluid communication with said die via said tube.

11. Pressure sensor of claim 10 wherein a portion of said tube extends above the surface of said plate, and said support structure surrounds said portion of said tube.

12. Pressure sensor of claim 1 wherein a tube extends through said plate, said reservoir being in fluid communication with said die via said tube, said tube being bonded to said plate by brazing, welding or soldering.

13. Pressure sensor of claim 1 wherein portions of said plate are thinned to permit said plate to flex at said thinned portions, whereby said plate at least partially insulates said die from mechanical force applied to the periphery of said plate.

14. Pressure sensor of claim 1 wherein said plate comprises a fill hole for permitting said liquid to be introduced into said reservoir, said fill hole being sealed.

15. Pressure sensor of claim 1 further comprising a cap formed over said die such that there is a cavity between said die and said cap, said cavity containing a vacuum.

16. Pressure sensor of claim 15 wherein said pressure sensor contains a pressure sensitive capacitive element having at least a first plate and a second plate, wherein said first plate is formed on said cap, and said second plate is formed on said die.

17. A pressure sensor comprising:
  a pressure sensing die having a first surface and a second surface, a pressure sensitive electronic component being formed in or on said pressure sensing die;
  one or more bonding wires electrically connected to a first side of said pressure sensing die for electrically accessing said pressure sensitive electronic component;
  a plate having a hole therein, said second surface of said pressure sensing die being affixed to said plate such that at least a portion of said second surface is in fluid communication with said hole, liquid being provided in said hole and pressing against said portion of said second surface, wherein said pressure sensing die provides a measure of the pressure with which said liquid presses against said die, and wherein said first surface is not in a liquid environment;
  a reservoir containing said liquid, said reservoir being in fluid communication with said pressure sensing die through said hole in said plate; and
  a diaphragm extending between said reservoir and a space, said diaphragm and said liquid applying pressure in said space to said pressure sensing die, said pressure sensing die measuring said pressure.

18. Pressure sensor of claim 1 wherein pressure sensitive resistors are formed in or on said die.

19. Pressure sensor of claim 17 wherein pressure sensitive resistors are formed in or on said die.

20. Pressure sensor of claim 17 wherein said die is affixed to a support structure and said support structure is affixed to said plate.

21. A pressure sensor comprising:
  a pressure sensing die having a first surface and a second surface, a pressure sensitive electronic component being formed in or on said first surface;
  a plate having a hole therein, said second surface of said pressure sensing die being affixed to said plate such that at least a portion of said second surface is in fluid communication with said hole, liquid being provided in said hole and pressing against said portion of said second surface, wherein said pressure sensing die provides a measure of the pressure with which said liquid presses against said die, and wherein said first surface is not in a liquid environment, and
  a diaphragm extending between said liquid and a space, said diaphragm and said liquid applying pressure in said space to said pressure sensing die.

22. Pressure sensor of claim 21 wherein said die is affixed to a support structure and said support structure is affixed to said plate.

23. A pressure sensor comprising:
  a pressure sensing die having a first surface and a second surface, a pressure sensitive electronic component being formed in or on said pressure sensing die;
  one or more bonding wires electrically connected to a first side of said pressure sensing die for electrically accessing said pressure sensitive electronic component;
  a plate having a hole therein, said second surface of said pressure sensing die being affixed to said plate such that at least a portion of said second surface is in fluid communication with said hole, liquid being provided in said hole and pressing against said portion of said second surface, wherein said pressure sensing die provides a measure of the pressure with which said liquid presses against said die, and wherein said first surface is not in a liquid environment; and
  a diaphragm extending between said liquid and a space, said diaphragm and said liquid applying pressure in said space to said pressure sensing die.

24. Pressure sensor of claim 23 wherein said die is affixed to a support structure and said support structure is affixed to said plate.

* * * * *